(12) United States Patent
Washizuka

(10) Patent No.: US 11,819,915 B2
(45) Date of Patent: Nov. 21, 2023

(54) BONDING MEMBER AND BONDING METHOD

(71) Applicant: Murata Manufacturing Co., Ltd., Nagaokakyo (JP)

(72) Inventor: Seitaro Washizuka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 769 days.

(21) Appl. No.: 15/786,964

(22) Filed: Oct. 18, 2017

(65) Prior Publication Data

US 2018/0036798 A1 Feb. 8, 2018

Related U.S. Application Data

(63) Continuation of application No. PCT/JP2016/058233, filed on Mar. 16, 2016.

(30) Foreign Application Priority Data

May 29, 2015 (JP) ................. 2015-110691

(51) Int. Cl.
*B22F 1/00* (2006.01)
*B23K 20/00* (2006.01)
(Continued)

(52) U.S. Cl.
CPC ............. *B22F 1/09* (2022.01); *B22F 7/064* (2013.01); *B23K 1/0002* (2013.01);
(Continued)

(58) Field of Classification Search
CPC .. B23K 35/0222; B23K 35/26; B23K 35/262; B23K 35/30; B23K 35/302;
(Continued)

(56) References Cited

U.S. PATENT DOCUMENTS 9,044,816 B2 6/2015 Nakano et al.
9,357,645 B2 5/2016 Ebe et al.
(Continued)

FOREIGN PATENT DOCUMENTS

CN 101416568 A 4/2009
JP S60-15490 U 2/1985
(Continued)

OTHER PUBLICATIONS

International Search Report issued in International Application No. PCT/JP2016/058233, dated Jun. 21, 2016.
(Continued)

*Primary Examiner* — Nicholas A Wang
(74) *Attorney, Agent, or Firm* — ArentFox Schiff LLP

(57) ABSTRACT

A bonding member that includes a resin body defining an airtight interior, and a bonding material enclosed in the interior of the resin body. The bonding material is a mixed powder that includes a plurality of particles of a first metal powder and a plurality of particles of a second metal powder. The second metal powder reacts with the first metal powder when melted to thereby produce an intermetallic compound. The resin body has a melting point higher than a softening point of the mixed powder.

17 Claims, 4 Drawing Sheets

(51) Int. Cl.
| | |
|---|---|
| B23K 35/26 | (2006.01) |
| C22C 13/00 | (2006.01) |
| B23K 1/20 | (2006.01) |
| B23K 35/30 | (2006.01) |
| B23K 20/16 | (2006.01) |
| B22F 7/06 | (2006.01) |
| B23K 1/19 | (2006.01) |
| C22C 9/05 | (2006.01) |
| B23K 35/02 | (2006.01) |
| C22C 13/02 | (2006.01) |
| C22C 9/06 | (2006.01) |
| B23K 1/00 | (2006.01) |
| B23K 20/02 | (2006.01) |
| H05K 3/34 | (2006.01) |
| C22C 9/00 | (2006.01) |
| B23K 101/42 | (2006.01) |

(52) U.S. Cl.
CPC ............. *B23K 1/0016* (2013.01); *B23K 1/19* (2013.01); *B23K 1/20* (2013.01); *B23K 20/00* (2013.01); *B23K 20/026* (2013.01); *B23K 20/16* (2013.01); *B23K 35/025* (2013.01); *B23K 35/0222* (2013.01); *B23K 35/0244* (2013.01); *B23K 35/26* (2013.01); *B23K 35/262* (2013.01); *B23K 35/30* (2013.01); *B23K 35/302* (2013.01); *C22C 9/00* (2013.01); *C22C 9/05* (2013.01); *C22C 9/06* (2013.01); *C22C 13/00* (2013.01); *C22C 13/02* (2013.01); *H05K 3/34* (2013.01); *H05K 3/3457* (2013.01); *B22F 2998/10* (2013.01); *B22F 2999/00* (2013.01); *B23K 2101/42* (2018.08); *H05K 2203/0425* (2013.01)

(58) Field of Classification Search
CPC .. B23K 20/026; B23K 20/16; B23K 35/0244; H05K 2203/0425; H05K 3/34; H05K 3/3457; B22F 3/12; B22F 1/0003; B22F 1/0059; B22F 2003/248; B22F 1/0014
See application file for complete search history.

(56) References Cited

U.S. PATENT DOCUMENTS

| | | | | |
|---|---|---|---|---|
| 2005/0029666 | A1* | 2/2005 | Kurihara | H01L 24/13 257/772 |
| 2006/0260122 | A1* | 11/2006 | Honjo | H05K 1/186 29/829 |
| 2009/0047534 | A1 | 2/2009 | Sakai et al. | |
| 2009/0155608 | A1* | 6/2009 | Nomura | C09J 9/02 428/457 |
| 2012/0156512 | A1 | 6/2012 | Nakano et al. | |
| 2013/0042912 | A1* | 2/2013 | Kurihara | B23K 35/262 136/256 |
| 2013/0233618 | A1* | 9/2013 | Nakano | B23K 35/025 174/94 R |
| 2013/0258632 | A1 | 10/2013 | Ebe et al. | |
| 2014/0178703 | A1 | 6/2014 | Nakano et al. | |
| 2014/0193650 | A1 | 7/2014 | Nakano et al. | |
| 2015/0239069 | A1 | 8/2015 | Nakano et al. | |
| 2018/0010017 | A1* | 1/2018 | Matsubayashi | C09D 7/40 |

FOREIGN PATENT DOCUMENTS

| | | |
|---|---|---|
| JP | 2013-202632 A | 10/2013 |
| JP | 2014-63846 A | 4/2014 |
| WO | WO 2011/027659 A1 | 3/2011 |
| WO | WO 2012/066795 A1 | 5/2012 |
| WO | WO 2013/038816 A1 | 3/2013 |
| WO | WO 2013/038817 A1 | 3/2013 |
| WO | WO 2014/002893 A1 | 1/2014 |

OTHER PUBLICATIONS

Written Opinion of the International Searching Authority issued in International Application No. PCT/JP2016/058233, dated Jun. 21, 2016.

* cited by examiner

BONDING MEMBER AND BONDING METHOD

CROSS REFERENCE TO RELATED APPLICATIONS

The present application is a continuation of International application No. PCT/JP2016/058233, filed Mar. 16, 2016, which claims priority to Japanese Patent Application No. 2015-110691, filed May 29, 2015, the entire contents of each of which are incorporated herein by reference.

FIELD OF THE INVENTION

The present invention relates to a bonding member and a bonding method for use in, e.g., bonding an electronic component to a substrate.

BACKGROUND OF THE INVENTION

Conventionally, as materials of bonding members for carrying out the mounting of electronic components onto substrates, various types of lead-free metal materials have been continuously developed. For example, Patent Document 1 discloses a bonding material (solder paste) including a metal powder composed of Sn and a metal powder composed of a CuNi alloy. When this bonding material reaches a higher temperature than the melting point of Sn through heat treatment, the Sn is melted to produce a Sn solution, and this Sn solution reacts with the CuNi alloy, thereby resulting in alteration to an intermetallic compound of Cu or Ni with Sn. The bonding material altered to such an intermetallic compound has a high heat resistance, and a higher remelting temperature than the melting point of Sn.

Patent Document 1: International Publication WO 2011/027659

SUMMARY OF THE INVENTION

For the bonding material mentioned above, in order to properly progress the reaction of the metal powder during the heat treatment, there is a need to add a flux for the reduction/removal of a surface oxide produced at the surface of the metal powder. However, the flux may corrode electrodes and the like of the electronic components, and bonding objects are limited to materials that have resistance to corrosion caused by the flux. In addition, there is a need for a step of cleaning a flux in the bonding process, thus leading to an increased number of steps, and limiting bonding objects to materials or structure that also have resistance to the cleaning.

An object of the present invention is to provide a bonding member which can prevent any surface oxide from inhibiting the melting and solidification of a bonding material.

A bonding member according to an embodiment of the present invention includes a resin body that has an airtight interior, and a bonding material including multiple metal powders enclosed within the interior of the resin body. The resin body is made of a material that has a melting point higher than a softening point of the multiple metal powders. In particular, the material of the resin body preferably has a melting point that is higher than a melting point of the multiple metal powders.

In accordance with these aspects, the multiple metal powders can be held within the resin body, with surface oxidation inhibited. In addition, in bonding the bonding member to bonding objects through a heat treatment, the metal powders are softened or melted in a temperature range that is lower than the temperature at which the resin body is melted, thereby making the bonding material integrated within the resin body, and thus reducing the surface area thereof. Therefore, when the bonding member reaches a higher temperature, thereby melting the resin body, the production of a surface oxide is inhibited even when the bonding material located within the resin body is exposed to the outside air. Thus, the bonding material can be melted and solidified almost without being affected by the surface oxide.

The bonding material also preferably includes no flux.

In accordance with this aspect, the bonding objects bonded with the bonding material are not corroded by any flux, and the materials of the bonding objects are not limited in this way.

The multiple metal powders preferably include a first metal powder, and a second meal powder that reacts with the first metal powder when melted to produce an intermetallic compound that has a higher melting point than the first metal powder. In particular, the first metal powder preferably includes Sn, and the second metal powder preferably includes a Cu—Ni alloy, a Cu—Mn alloy, a Cu—Cr alloy, or a Cu—Al alloy.

In accordance with these aspects, when the bonding material is melted by heating, the material is altered to an intermetallic compound. Therefore, when this bonding material is solidified by cooling, the material has high heat resistance, with a remelting temperature higher than the melting point of the first metal powder.

The resin body preferably has a melting point in the temperature range in which the intermetallic compound is produced.

In accordance with this aspect, the bonding material is not exposed to the outside air through melting of the resin body, until the bonding material starts to be altered to the intermetallic compound. Therefore, the alteration to the intermetallic compound in the bonding material can be prevented from being inhibited by any surface oxide.

Furthermore, a bonding method according to an aspect of the present invention includes a first step of disposing, between a first bonding object and a second bonding object, a bonding member that includes a resin body defining an airtight interior; and a bonding material including multiple metal powders and which is enclosed within the resin body, and the resin body is made of a material having a melting point higher than a softening point of the multiple metal powders; and a second step of applying, to the bonding member disposed between the first bonding object and the second bonding object, a heat treatment at a temperature at which the resin body is melted.

In accordance with this bonding method, the bonding material is melted and solidified without being inhibited by any surface oxide, even when the bonding member contains no flux at all, or contains only a small amount of flux. Therefore, the bonding objects can be prevented from being corroded by the flux, and the materials of the bonding objects are not limited in any way.

In the second step, a pressure is preferably applied to the bonding member through the first bonding object and the second bonding object.

In accordance with this bonding method, the melted resin body is extruded from between each bonding object and the bonding material, thus making it possible to achieve bonding between each bonding object and the bonding material in a more reliable manner.

In the second step, the melted resin body surrounds a metal bonding body which is a reaction product from the metal powders, and is exposed from the first bonding object and the second bonding object.

In accordance with this bonding method, the bonding material is made unlikely to be exposed to the outside air even after the resin body is melted, and the production of surface oxides at the bonding material can be thus further prevented.

In the second step, the melted resin body preferably penetrates into voids formed in the metal bonding body.

In accordance with this bonding method, the resin body penetrates into the voids at the contact surface between the bonding material and each bonding object, thereby increasing the bonding strength between the two.

The metal powders mentioned previously include a first metal powder and a second metal powder that reacts with the first metal powder when melted to produce an intermetallic compound that has a higher melting point than the first metal powder. Also, at least one of the first bonding object and the second bonding object preferably has a surface that contacts the bonding material and includes a metal of the second metal powder.

In accordance with this bonding method, the bonding strength between the bonding material and the bonding object is further increased, because an intermetallic compound is produced by the reaction between a metal constituting the first metal powder included in the bonding material, and a metal of the second metal powder included in the surface of the bonding object.

According to the present invention, in the bonding member, the bonding material can be melted and solidified without being inhibited by any surface oxide.

DETAILED DESCRIPTION OF PREFERRED EMBODIMENTS OF THE INVENTION

A bonding member according to a first embodiment of the present invention and a bonding method with the use of the bonding member will be described below.

Figure 1A:
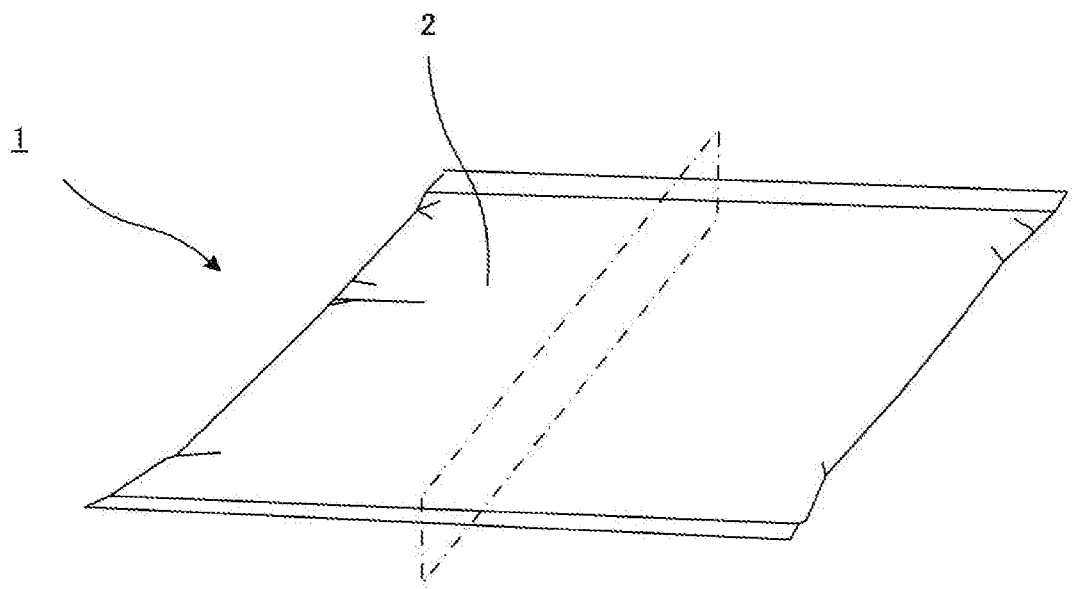
FIG. 1(A) is a perspective view of a bonding member 1 according to a first embodiment of the present invention.
Figure 1B:
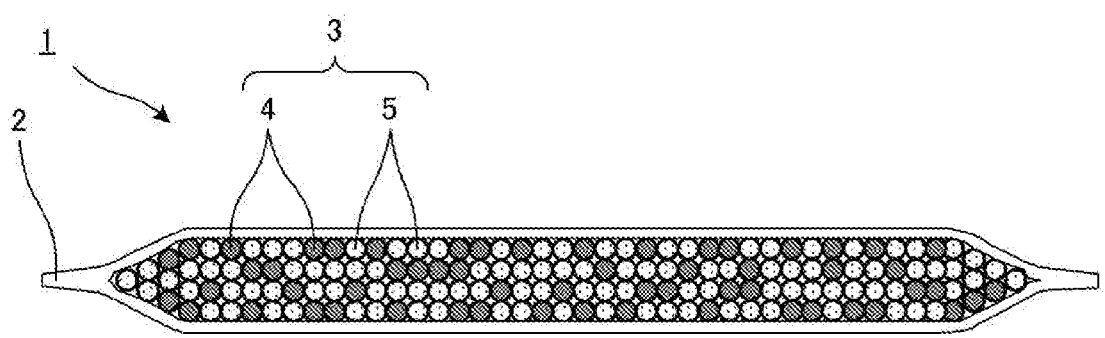
FIG. 1(B) is a schematic cross-sectional view of the bonding member 1.

FIG. 1(A) is a perspective view of a bonding member 1 according to a first embodiment of the present invention. FIG. 1(B) is a schematic cross-sectional view of the bonding member 1.

The bonding member 1 includes a resin body 2 and a bonding material 3. The resin body 2 encloses, in the airtight interior thereof, the bonding material 3. The resin body 2 herein is configured to have two flexible resin films attached to each other. The interior of the resin body 2 preferably has free oxygen removed (reduced) by degassing treatment, deoxygenation treatment, treatment of filling with an inert gas such as nitrogen, argon, helium, or xenon, or the like. In addition, the resin films constituting the resin body 2 preferably have a low oxygen permeability.

The resin constituting the resin body 2 is a material that is not melted at the melting point of Sn included in the bonding material 3. In addition, the material of the resin body melts and flows after a heat treatment (described in further detail herein) initiates a reaction for the production of an intermetallic compound, but at the same time, does not burn out at the maximum temperature of the heat treatment. Materials that can be employed as the foregoing resin body 2 include polyester resins, polyethylene terephthalate (PET), polybutylene terephthalate (PBT), polycarbonate (PC), nylon 6, nylon 66, polyvinyl chloride (PVC), polyacetal resins (POM), polyphenylene sulfide (PPS), polyimide (PI), polyetheramide (PEI), polyetheretherketone (PEEK), polypropylene (PP), and the like. Among these materials, the material suitable for the achievement of the temperature characteristics mentioned above may be selected, and adopted as a material for the resin body 2.

The bonding material 3 is, in the condition before heat treatment, a mixed powder including a plurality of particles of a first metal powder 4 and a plurality of particles of a second metal powder 5. In this regard, the bonding material 3 is adapted as a dried powder with no liquid added thereto, and configured in an amorphous form by compressing the multiple metal powders through the application of a pressure before sealing in the interior of the resin body.

In addition, the first metal powder 4 is preferably a single metal of Sn, or an Sn alloy (e.g., Sn—Ag—Cu, Sn—Ag, Sn—Cu, Sn—Bi, Sn—Sb, Sn—Au, Sn—Pb, Sn—Zn).

The second metal powder 5 is preferably an alloy of Cu (preferably, a Cu-10Ni alloy, besides, a Cu—Ni alloy where the proportion of Ni is 5 to 20 weight %, or a Cu—Mn alloy where the proportion of Mn is 5 to 20 weight %, or a Cu—Cr alloy, a Cu—Al alloy, or the like).

It is to be noted that the first metal powder 4 may have other materials, as long as the first metal powder 4 has a lower melting point than the second metal powder 5. In addition, the second metal powder 5 may have other materials, as long as the second metal powder 5 has the property of reacting with the first metal powder 4 when melted to produce an intermetallic compound. In the following description, the first metal powder 4 is referred to as a Sn powder 4, whereas the second metal powder 5 is referred to as a Cu alloy powder 5.

Further, the bonding material 3, the Sn powder 4, and the Cu alloy 5 may contain Ag, Au, Al, Bi, C, Co, Cu, Fe, Ga, Ge, In, Mn, Mo, Ni, P, Pb, Pd, Pt, Si, Sb, Zn, and the like. These additives may have the form as impurities incorporated in the Sn powder 4 or the Cu alloy 5, or may have the form as a metal powder or the like added to the bonding material 3, apart from the Sn powder 4 and the Cu alloy 5. In addition, in the case of addition as a metal powder or the like, the foregoing elements may be included in the form of a metal complex or a metal compound.

In addition, the combination ratio between the Sn powder 4 and the Cu alloy powder 5 preferably falls within the range of Sn powder 4:Cu alloy powder 5=50:50 to 70:30 in ratio by weight. When the combination amount of the Sn powder 4 is excessively large, whereas the combination amount of the Cu alloy powder 5 is excessively small, there is a possibility that the unreacted Sn component may remain excessively in bonding material 3 after the after-mentioned heat treatment. On the other hand, when the combination amount of the Cu alloy powder 5 is excessively large, whereas the combination amount of the Sn powder 4 is excessively small, there is a possibility that the unreacted Cu alloy component may remain excessively in bonding material 3 after the after-mentioned heat treatment. When each metal powder remains excessively in the bonding material 3 after the heat treatment, there is a possibility that the bonding material 3 may turn into a porous form, thereby significantly decreasing the bonding strength.

In addition, the average particle size (D50) of the Sn powder 4 preferably falls within the range of 1 to 30 μm. When the Sn powder 4 is smaller than 1 μm in average particle size, more surface oxide is formed due to the increased proportion of the surface area, and the wettability to the Cu alloy powder 5 is decreased, thereby inhibiting the reaction. On the other hand, when the Sn powder 4 is larger than 30 μm in average particle size, large voids are formed around the Cu alloy powder 5 when Sn is melted.

In addition, the average particle size (D50) of the Cu alloy powder 5 preferably falls within the range of 1 to 30 μm. When the Cu alloy powder 5 is smaller than 1 μm in average particle size, more surface oxide is formed also due to the increased proportion of the surface area, and the wettability to the melted Sn is decreased, thereby inhibiting the reaction. On the other hand, when the Cu alloy powder 5 is larger than 30 μm in average particle size, the reaction fails to proceed insufficiently into the Cu alloy powder 5, and there is a possibility that the unreacted Cu alloy powder 5 may remain excessively after the reaction.

In the bonding member 1 configured as described above, the bonding material 3 in the form of the mixed powder is enclosed in the airtight interior of the resin body 2, thereby making surface oxide less likely to be formed at the surfaces of the Sn powder 4 and Cu alloy powder 5 constituting the bonding material 3. Therefore, in bonding the bonding material 3 to a bonding object later, the reaction between the Sn powder 4 and the Cu alloy powder 5 can be developed properly without being inhibited by any surface oxide.

A specific bonding method for bonding a first bonding object 101 and a second bonding object 102 with the use of the bonding member 1 will be described below.

Figure 2:
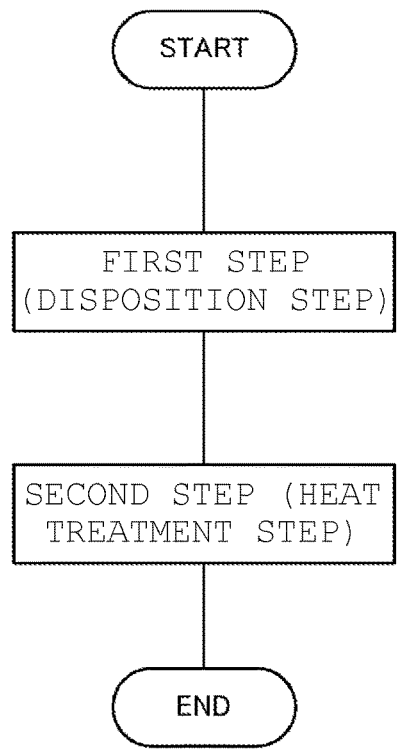
FIG. 2 is a diagram showing a flowchart of a bonding method according to the first embodiment of the present invention.
Figure 3:
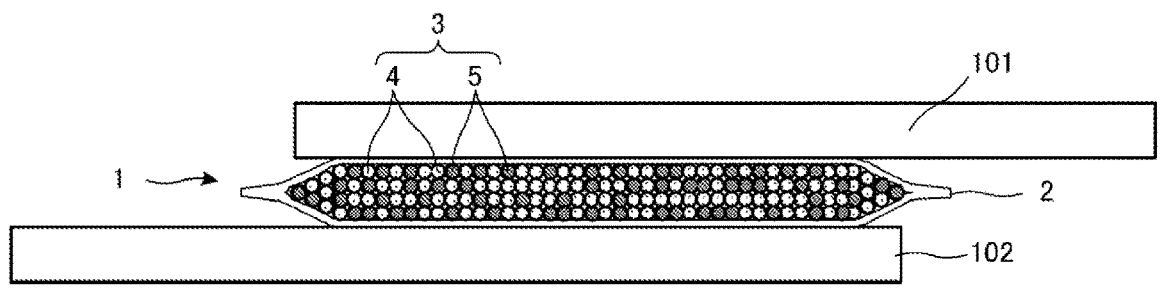
FIG. 3 is a cross-sectional view schematically illustrating a first step carried out in the bonding method according to the first embodiment of the present invention.

FIG. 2 is a diagram showing a flowchart in a bonding method with the use of the bonding member 1. FIG. 3 is a cross-sectional view schematically illustrating a first step (disposition step) in the bonding method with the use of the bonding member 1. The first bonding object 101 and second bonding object 102 shown herein serve as electrode terminals configured independently like bus bars, through which a large current flow. It is to be noted that the first bonding object 101 and the second bonding object 102 may be electrode members formed on the surface of a body, like surface electrodes of an electronic component such as a multilayer ceramic capacitor, and electrode members provided on the surface of a printed wiring board on which an electronic component is mounted.

First, in the first step, under a normal-temperature environment, as shown in FIG. 3, the bonding member 1 is disposed between the first bonding object 101 and the second bonding object 102. In this condition, the bonding material 3 of the bonding member 1 has the form of a mixed powder including the Sn powder 4 and the Cu alloy powder 5, which is enclosed in the resin body 2 without being exposed to the outside air.

Next, in a second step (heat treatment step), the bonding member 1 is heated while compressing the bonding member 1 from the thickness direction through the first bonding object 101 and the second bonding object 102.

Figure 4A:
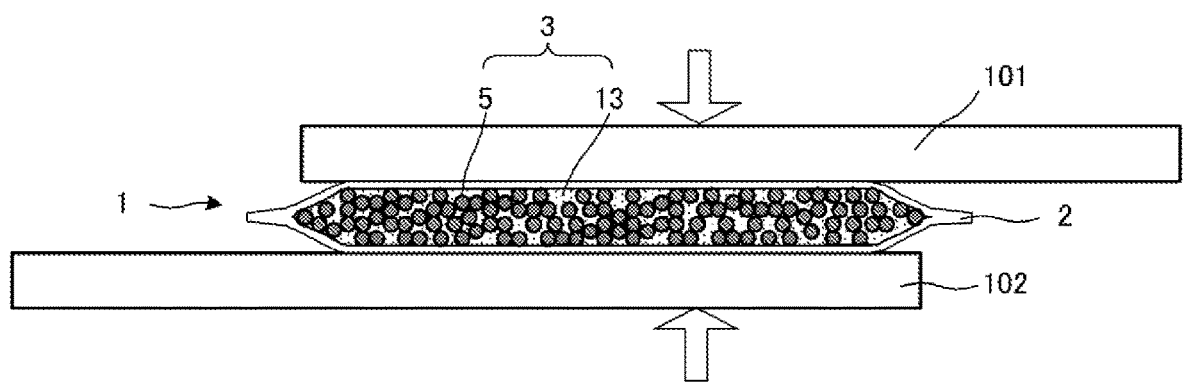
FIG. 4(A) is a cross-sectional view schematically illustrating a first-half process of a second step in the bonding method with the use of the bonding member 1.
Figure 4B:
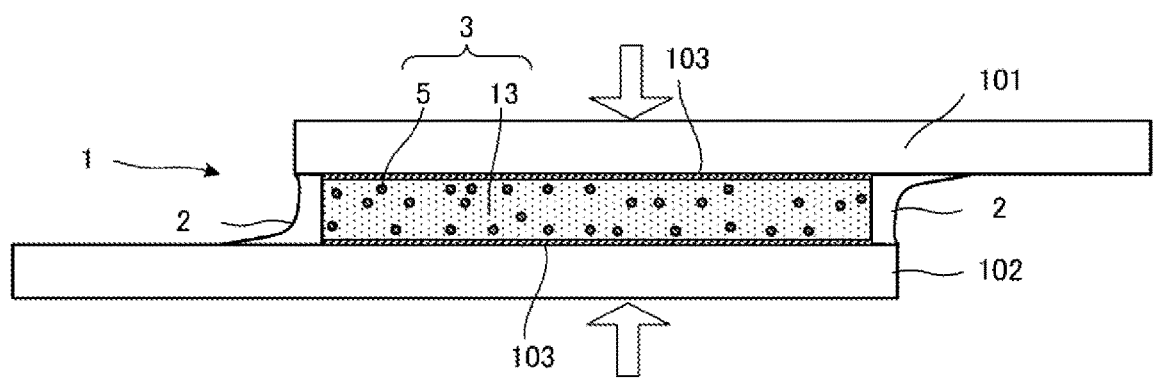
FIG. 4(B) is a cross-sectional view schematically illustrating a second-half process of the second step in the bonding method with the use of the bonding member 1.
Figure 5:
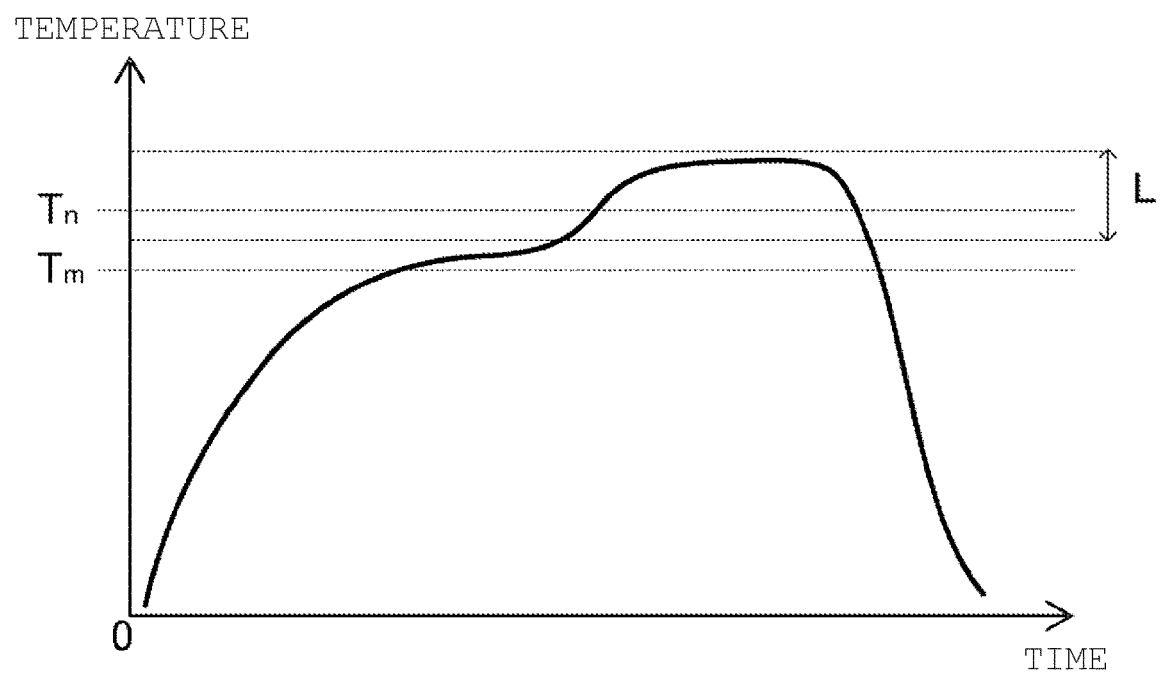
FIG. 5 is a diagram showing a temperature profile for the bonding method according to the first embodiment of the present invention.

FIG. 4(A) is a cross-sectional view schematically illustrating a first-half process of the second step in the bonding method with the use of the bonding member 1. FIG. 4(B) is a cross-sectional view schematically illustrating a second-half process of the second step in the bonding method with the use of the bonding member 1. FIG. 5 is a diagram showing a temperature profile in the second step in the bonding method with the use of the bonding member 1. In FIG. 5, the temperature $T_m$ is a temperature at which the bonding material 3 is softened or melted. The temperature $T_n$ is a temperature at which the resin body 2 is melted. The temperature range L refers to a temperature range that sufficiently accelerates the after-mentioned reaction for the production of an intermetallic compound.

In the first-half process of the second step (see FIG. 4(A)), the temperature of the bonding member 1 is increased to around the melting point of Sn, thereby softening or melting the bonding material 3, and thus integrating the bonding material 3. Specifically, in accordance with the temperature profile shown in FIG. 5, the bonding member 1 is kept in a temperature range in excess of the temperature $T_m$ for a certain period of time, thereby integrating the bonding material 3. In this regard, there is a need for the temperature of the bonding member 1 to be adapted not to reach the melting point $T_n$ of the resin body 2. Thus, with the sealed condition maintained by the resin body 2, the bonding material 3 softened or melted is kept enclosed in the resin body 2 without being exposed to the outside air.

It is to be noted that Sn has a melting point $T_m$ of 231.9° C., and in the first-half process of the second step, for example, the bonding member 1 may be kept in the temperature range of 235 to 240° C. for approximately 1 to 5 minutes. Thus, as shown in FIG. 4(A), the Sn powder 4 is almost all melted, and changed into a solution 13, thereby resulting in the Cu alloy powder 5 dispersed in the Sn solution 13. In this case, a material that is higher in melting point $T_n$ than approximately 240° C. may be adopted for the resin body 2.

In the second-half process of the second step (see FIG. 4(B)), the temperature of the bonding member 1 is further increased, thereby causing the temperature of the bonding member 1 to reach a temperature range in excess of the melting point $T_n$ of the resin body 2.

Thus, the resin body 2 is melted to flow, thereby leading to release of the bonding material 3 sealed by the resin body 2. This bonding material 3 is softened or melted, and then integrated, and the surface area thereof is thus reduced. Therefore, the amount of surface oxide produced at the surface of the bonding material 3 is reduced even when the resin body 2 is melted to expose the bonding material 3 to the outside air.

In addition, the melted resin body 2 has high viscosity, and thus stays in a location surrounding the bonding material 3 without flowing away significantly from the bonding material 3.

Thus, the softened or melted bonding material 3 also stays between the first bonding object 101 and the second bonding object 102. Then, at least some of the melted resin body 2, which has been located between the first bonding object 101 or second bonding object 102 and the bonding material 3, flows out toward the side surface of the bonding material 3, and penetrates into voids formed in the bonding material 3. Thus, the resin body 2 located between the first bonding object 101 or second bonding object 102 and the bonding material 3 is reduced, thereby leading to contact between the first bonding object 101 or the second bonding object 102 and the bonding material 3.

In this regard, the application of a pressure to the resin body 2 and the bonding material 3 from the first bonding object 101 and the second bonding object 102 can push out the resin body 2 reliably from between the first bonding object 101 or second bonding object 102 and the bonding material 3. Therefore, the first bonding object 101 or second bonding object 102 and the bonding material 3 are brought into contact with each other in a more reliable manner.

As just described, the melted resin body 2 stays around the bonding material 3 exposed from the first bonding object 101 or the second bonding object 102, thereby keeping the softened or melted bonding material 3 less exposed to the outside air. This also reduces the amount of surface oxide produced at the surface of the bonding material 3.

In melting the resin body 2 as mentioned above, the temperature of the bonding member 1 is preferably kept at a temperature that falls within the temperature range L in which the reaction for the production of the intermetallic compound is accelerated adequately. Then, in the bonding material 3, the Sn included in the solution 13 reacts with the metal such as Cu or Ni included in the Cu alloy powder 5, thereby altering the solution 13 to an intermetallic compound, and reducing the Cu alloy powder 5 in particle size and then leading to disappearance thereof.

This reaction for producing the intermetallic compound is, for example, a reaction associated with liquid phase diffusion bonding ("TLP bonding: Transient Liquid Phase Diffusion Bonding"). The produced intermetallic compound is, when the Cu alloy powder 5 is a Cu—Ni alloy, for example, $(Cu,Ni)_6Sn_5$, $Cu_4Ni_2Sn_5$, $Cu_5NiSn_5$, $(Cu,Ni)_3Sn$, $Cu_2NiSn$, $CuNi_2Sn$, or the like. Alternatively, when the Cu alloy powder 5 is a Cu—Mn alloy, the intermetallic compound is $(Cu,Mn)_6Sn_5$, $Cu_4Mn_2Sn_5$, $Cu_5MnSn_5$, $(Cu,Mn)_3Sn$, $Cu_2MnSn$, $CuMn_2Sn$, or the like.

The temperature range L in which the reactions for the production of the various types of intermetallic compounds mentioned above are accelerated adequately is approximately 250 to 280° C. Therefore, in this case, the bonding member 1 is kept at 250 to 280° C. for approximately 2 to 5 minutes, thereby making it possible to almost completely react Sn included in the solution 13 and the Cu alloy included in the Cu alloy powder 5, and thus alter the solution 13 to the intermetallic compound. For this reason, the melting point $T_n$ of the resin body 2 preferably falls within the temperature range in which the reaction for the production of the intermetallic compound is accelerated, thereby allowing the resin body 2 to melt and flow simultaneously in promoting the reaction for the production of the intermetallic compound. Further, the reaction for the production of the intermetallic compound can be prevented from being inhibited by the surface oxide of the bonding material 3.

It is to be noted that the first bonding object 101 and the second bonding object 102 preferably include, in at least contact surfaces with the bonding member 1, the metal constituting the Cu alloy powder 5 included in the bonding material 3. For example, the first bonding object 101 and the second bonding object 102 can be adapted to have a single metal of Ni, Zn, Cu, Cr, or Al, or an alloy such as Cu—Zn, Cu—Ni, Cu—Sn, Cu—Cr, or Cu—Al containing Cu as its main constituent, or to have base material surfaces plated with these metals. In this case, these metals react with the Sn included in the bonding material 3, thereby producing an alloy layer 103 composed of an intermetallic compound at the surfaces of the first bonding object 101 and second bonding object 102. The intermetallic compound of the alloy layer 103 is, for example, $Cu_3Sn$, $Cu_6Sn_5$, or the like. The formation of such an alloy layer 103 can further increase the bonding strength between the solidified bonding material 3 and the first bonding object 101 and second bonding object 102.

Carrying out the heat treatment as described above in the second step can melt the bonding material 3 almost without being affected by any surface oxide, even when almost no flux is added to the bonding member 1. Further, after the second step, the bonding material 3 is subjected to natural cooling, thereby solidifying the bonding material 3, and thus making it possible to bond a metal bonding body as a reaction product from the bonding material 3 between the first bonding object 101 and the second bonding object 102. Therefore, even when almost no flux is added to the bonding member 1, the bonding material 3 can be melted and solidified almost without being affected by any surface oxide, and the first bonding object 101 and the second bonding object 102 are not to be considered limited to materials that are not corroded by flux. The metal bonding body as a reaction product from the bonding material 3, bonded between the first bonding object 101 and the second bonding object 102, is obtained by the alteration to the intermetallic compound, and thus highly heat-resistant with a remelting temperature higher than the temperature at which Sn is melted.

It is to be noted that while the configuration of the two resin films attached to each other has been described as the resin body 2 in this embodiment, the resin body according to the present invention is not to be considered limited to this configuration. For example, the resin body according to the present invention can be configured in other ways, such as configured to have the bonding material 3 enclosed in a thicker resin case or the like, or configured to have the bonding material 3 covered by resin potting or the like.

In addition, while the mixed powder compressed for the bonding material 3 before heat treatment has been described in this embodiment, the bonding material according to the present invention is not to be considered limited to this configuration. For example, the bonding material according to the present invention may be configured as a mixed powder configured with fluidity kept high without being compressed, or configured in a paste form by adding a liquid such as a solvent or a thixotropic agent. In addition, the bonding material may be configured so as to include only one type of metal powder.

In this regard, a bonding member according to a second embodiment of the present invention will be described with reference to, as an example, a case of making the composition of the bonding material different from that in the first embodiment.

Figure 6:
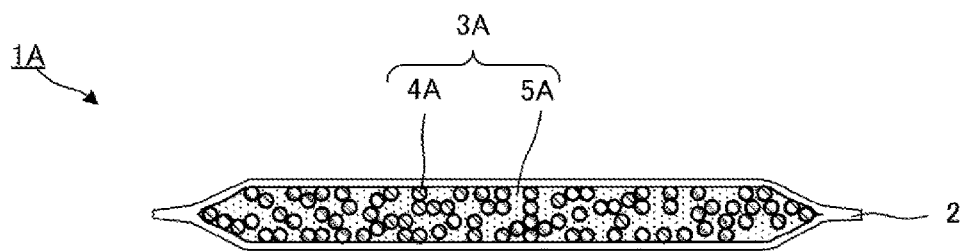
FIG. 6 is a schematic cross-sectional view of a bonding member according to a second embodiment of the present invention.

FIG. 6 is a cross-sectional view schematically illustrating a bonding member 1A according to the second embodiment of the present invention. The bonding member 1A includes a bonding material 3A configured differently from the configuration according to the previous embodiment. The bonding material 3A includes only a Sn powder 4A as a metal powder, and has a paste form obtained by mixing an additive 5A to the Sn powder 4A.

As just described, the bonding material 3A of the bonding member 1A can be configured so as to include only one metal powder. In addition, the bonding material 3A of the bonding member 1A can be also configured so as to have a paste form. When the bonding material 3A is configured in any way, the bonding material 3A preferably contains no flux component at all, or if any, contains an extremely small amount of flux component. Even in this way, as long as the bonding material 3A is enclosed in the resin body 2, the bonding material 3A can be bonded without being corroded, even when bonding objects with the bonding material 3A are such materials that are corroded by the flux component.

Finally, the foregoing descriptions of the respective embodiments should be considered exemplary in all respects, but not be considered limiting. The scope of the present invention is specified by the claims, but not by the embodiments described above. Furthermore, the scope of the present invention encompasses the scope equivalent to the claims.

DESCRIPTION OF REFERENCE SYMBOLS 1, 1A: bonding member
2: resin body
3, 3A: bonding material
4, 4A: first metal powder (Sn powder)
5: second metal powder (Cu alloy powder)
5A: additive
13: solution
101, 102: bonding object
103: alloy layer

The invention claimed is:

1. A bonding member comprising:
a resin body comprising two resin films attached to each other so as to define an airtight interior; and
a bonding material comprising multiple metal powders, and enclosed within the airtight interior defined by the two resin films,
wherein the two resin films comprise a material having a melting point higher than a melting point of the multiple metal powders, and
wherein the bonding material comprises no flux.

2. The bonding member according to claim 1, wherein the multiple metal powders comprise a first metal powder, and a second metal powder that reacts with the first metal powder when melted to produce an intermetallic compound that has a higher melting point than the first metal powder.

3. The bonding member according to claim 2, wherein the first metal powder comprises Sn, and the second metal powder comprises a Cu—Ni alloy, a Cu—Mn alloy, a Cu—Cr alloy, or a Cu—Al alloy.

4. The bonding member according to claim 3, wherein a ratio between the first metal powder and the second metal powder is within a range of 50:50 to 70:30 by weight.

5. The bonding member according to claim 3, wherein an average D50 particle size of the first metal powder is within a range of 1 to 30 μm, and an average D50 particle size of the second metal powder is within a range of 1 to 30 μm.

6. The bonding member according to claim 2, wherein the melting point of the material of the two resin films is in a temperature range in which the intermetallic compound is produced.

7. The bonding member according to claim 1, wherein the material of the two resin films is selected from polyester resins, polyethylene terephthalate, polybutylene terephthalate, polycarbonate, nylon 6, nylon 66, polyvinyl chloride, polyacetal resins, polyphenylene sulfide, polyimide, polyetheramide, polyetheretherketone, and polypropylene.

8. A bonding method comprising:
disposing a bonding member between a first bonding object and a second bonding object, the bonding member comprising a resin body comprising two resin films attached to each other so as to define an airtight interior, and a bonding material comprising multiple metal powders enclosed within the airtight interior defined by the two resin films, the two resin films comprising a material having a melting point higher than a melting point of the multiple metal powders, and the bonding material comprising no flux; and
applying, to the bonding member disposed between the first bonding object and the second bonding object, a heat treatment at a temperature at which the two resin films are melted.

9. The bonding method according to claim 8, further comprising applying a pressure to the bonding member through the first bonding object and the second bonding object during the applying of the heat treatment.

10. The bonding method according to claim 8, wherein the heat treatment is conducted such that the two resin films flow and surround a metal bonding body which is a reaction product of the multiple metal powders.

11. The bonding method according to claim 10, wherein the two resin films penetrate into voids in the metal bonding body.

12. The bonding method according to claim 8,
wherein the multiple metal powders comprise a first metal powder and a second metal powder that reacts with the first metal powder when melted to produce an intermetallic compound that has a higher melting point than the first metal powder, and
at least one of the first bonding object and the second bonding object has a surface that contacts the bonding material and comprises a metal of the second metal powder.

13. The bonding method according to claim 12, wherein the first metal powder comprises Sn, and the second metal powder comprises a Cu—Ni alloy, a Cu—Mn alloy, a Cu—Cr alloy, or a Cu—Al alloy.

14. The bonding member according to claim 13, wherein a ratio between the first metal powder and the second metal powder is within a range of 50:50 to 70:30 by weight.

15. The bonding method according to claim 13, wherein an average D50 particle size of the first metal powder is within a range of 1 to 30 μm, and an average D50 particle size of the second metal powder is within a range of 1 to 30 μm.

16. The bonding method according to claim 12, wherein the melting point of the material of the two resin films is in a temperature range in which the intermetallic compound is produced.

17. The bonding method according to claim 8, wherein the material of the two resin films is selected from polyester resins, polyethylene terephthalate, polybutylene terephthalate, polycarbonate, nylon 6, nylon 66, polyvinyl chloride, polyacetal resins, polyphenylene sulfide, polyimide, polyetheramide, polyetheretherketone, and polypropylene.

* * * * *